United States Patent [19]
Dromgoole

[11] Patent Number: 5,457,620
[45] Date of Patent: Oct. 10, 1995

[54] CURRENT ESTIMATING CIRCUIT FOR SWITCH MODE POWER SUPPLY

[75] Inventor: Douglas J. Dromgoole, Dallas, Tex.

[73] Assignee: AT&T IPM Corp., Coral Gables, Fla.

[21] Appl. No.: 99,781

[22] Filed: Jul. 30, 1993

[51] Int. Cl.[6] .................................................. H02M 3/335
[52] U.S. Cl. ............................................ 363/21; 363/97
[58] Field of Search ............................ 363/15, 16, 20, 363/21, 74, 78, 95, 97, 131

[56] References Cited

U.S. PATENT DOCUMENTS

| | | | |
|---|---|---|---|
| 4,885,671 | 12/1989 | Peil | 363/17 |
| 4,947,021 | 8/1990 | Stava | 219/130.51 |
| 5,066,900 | 11/1991 | Bassett | 323/224 |
| 5,126,931 | 6/1992 | Jitaru | 363/21 |
| 5,138,543 | 8/1992 | Harm et al. | 363/21 |
| 5,285,366 | 2/1994 | Zaretsky | 363/56 |
| 5,317,499 | 5/1994 | Brakus | 363/56 |

FOREIGN PATENT DOCUMENTS

| | | |
|---|---|---|
| 0147040 | 3/1985 | European Pat. Off. . |
| 3909174 | 10/1989 | Germany . |

Primary Examiner—Peter S. Wong
Assistant Examiner—Adolf Berhane
Attorney, Agent, or Firm—Alfred G. Steinmetz

[57] ABSTRACT

In a switch mode power supply the switch current of the power switch is connected to a low pass filter network during the time interval when current is flowing through the power switch. The filter network is disconnected from the power switch when switch current is not flowing. This technique takes advantage of the fact that the average current through the power switch during its conduction interval is either equal to the output current of the power supply, or is proportional with the ratio between the average switch current and the output current being the fixed isolation transformer turns ratio.

19 Claims, 5 Drawing Sheets

CURRENT ESTIMATING CIRCUIT FOR SWITCH MODE POWER SUPPLY

FIELD OF THE INVENTION

This invention relates to power supplies and their regulation and in particular to a means of accurately measuring the DC output current of a power supply using a power switch current signal.

BACKGROUND OF THE INVENTION

Traditional methods of developing a signal relating to the output current of a power supply are often either inaccurate, expensive, or dissipate excessive power.

One such method uses a small resistor in series with the power supply output lead (e.g. commonly, in series with the output filter inductor). The voltage across this resistor is directly proportional to the output current. This method has some disadvantages. For high current outputs this technique dissipates significant power. If the signal developed across the sense resistor is small in order to reduce power consumption, an expensive precision amplifier must be used to accurately amplify the signal to workable levels.

The disadvantages of expensive electronics and power dissipation may be over come to some degree by inferring the output current of an isolated switch mode power supply from a power switch current signal. Making use of the power switch current signal is advantageous since this signal is often already present for the purpose of power switch protection and power unit dynamic control.

Direct resistive measurement of the current through the power switch has the advantage of reduced power dissipation in the sense resistor element if the power switch current sensed is that of the primary switch of a step-down converter, or if the switch current is sensed using a current sense transformer technique. However, sensing the switch current produces a time varying signal whose average is often equal to the power unit's input current, not its output current. The output current must be inferred from the switch current signal. A common technique involves placing a standard peak detector circuit across the sense signal. This technique has two major sources of error: one is that this method senses the peak of the sense signal, which is corrupted by AC transformer magnetizing current and output inductor ripple current. Another source of error is the forward drop of the peak detector diode, which is often a significant fraction of the sensed signal's amplitude.

A technique used to improve the accuracy of the output current estimation from the power switch current signal uses a timing circuit that attempts to determine the midpoint of the interval in which current is flowing through the power switch, and then sampling the sense signal at that instant. This technique is complicated, and is prone to timing errors when used in conjunction with high frequency, short period power converters that operate with substantially varying duty ratios of switch conduction.

SUMMARY OF THE INVENTION

In a switch mode power supply described herein a voltage signal proportional to the current through a power switch is connected to a low-pass filter network during the time interval when current is flowing through the power switch. The filter network is disconnected from the power switch when switch current is not flowing. This technique takes advantage of the fact that the average current flowing through the power switch during its conduction interval is substantially proportional to the output current of the power supply, with the proportionality factor precisely known and constant.

A particular implementation disclosed herein takes advantage of the fact that significant corrupting currents present in the power switch current of some switch mode power converter topologies have properties that are counteracted by the filtering network.

The filter circuitry is intermittently connected by a controlled connecting switch across a device or other arrangement generating a voltage signal representing the current through the power switch. The connecting switch is enabled by the voltage signal that drives the power switch. This gating voltage signal, applied to the connecting switch, is already in timing synchronization and magnitude range with the conduction interval of the power switch.

DETAILED DESCRIPTION

Figure 1:
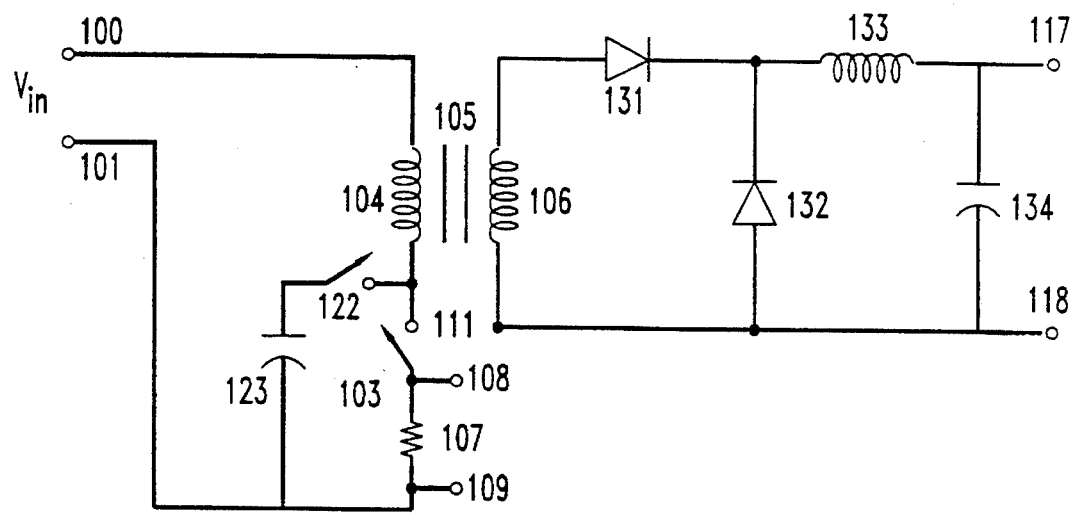
FIG. 1 is a schematic of an isolated buck type switch mode power supply.

A schematic of an isolated buck type converter is shown in FIG. 1. As shown, a DC voltage source $V_{in}$ is applied across the input leads 100 and 101. One termination of the primary winding 104 of isolation transformer 105 is connected to lead input 100. The other termination is connected to ends of the reset switch 122 and power switch 111. Power switch 111, switch may be a FET semiconductor device, connects the primary winding 104 of transformer 105 to a current sense resistor 107. Application of drive signals to bias the power switch conducting/non-conducting is shown schematically by the dotted line 103. The reset switch 122 connects the primary winding 104 of transformer 105 to a reset capacitor 123.

The secondary winding 106 of power transformer 105 is connected, via the rectifying diodes 131 and 132 to an output filter circuit. The filter is comprised of an inductor 133 in series with the output terminal 117 and a capacitor 134 shunting the output terminals 117 and 118.

Figure 3:
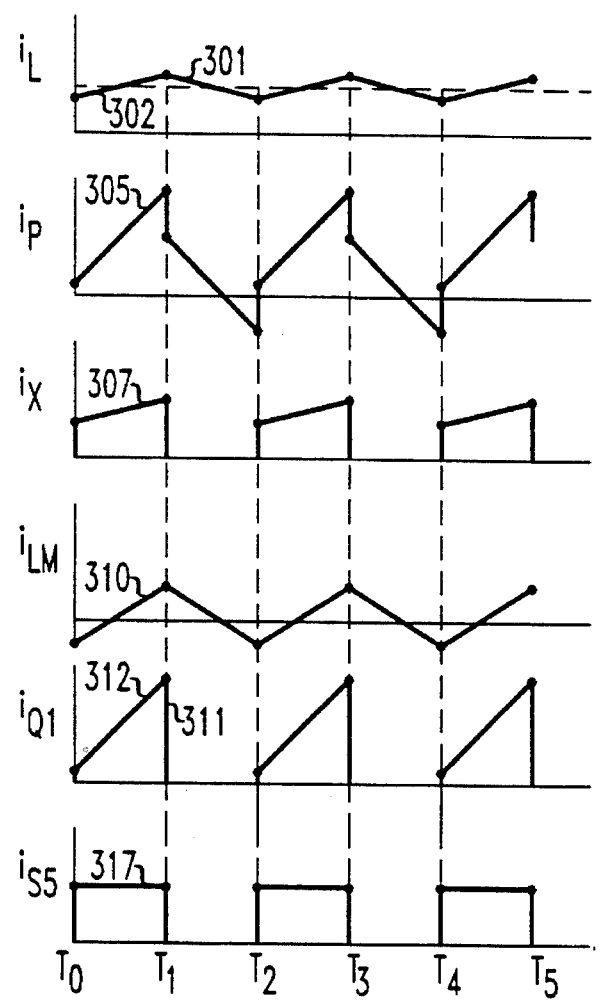
FIG. 3 is a diagram of operating waveforms for the circuit of FIG. 1.

Operating waveforms of the converter of FIG. 1 are shown in FIG. 3. Waveform 301, designated $i_l$, graphs the current flowing through the output filter inductor 133. The average output current of the power supply is shown by the dotted line 302. A current sensing circuit is connected to the leads 108 and 109 to sense the voltage across resistor 107 during conduction of power switch 111 to infer the average current level $<i_L>$ designated by dotted line 302. Waveform 305, designated $i_p$, shows the current flowing through the primary winding 104 of power transformer 105.

Figure 2:
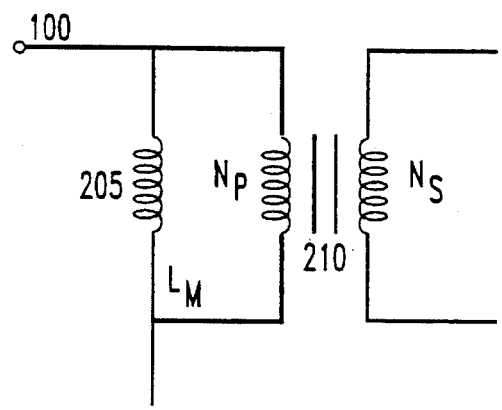
FIG. 2 shows an equivalent circuit for the isolating power transformer of the circuit of FIG. 1.

The primary current of the power transformer can be considered to have two components. FIG. 2 shows an equivalent circuit for the power transformer 105 of FIG. 1, The equivalent circuit includes a magnetizing inductance 205, designated $L_m$ and connected in shunt with the primary winding of an ideal transformer 210 with Np primary turns and $N_s$ secondary turns. The magnetizing inductance $L_m$ can be considered to have a current $i_{lm}$ shown as waveform 310 in FIG. 3. The primary of the ideal transformer 210 has the current, shown by waveform 307, and designated $i_x$. The current $i_p$ shown by waveform 305, in FIG. 3 equals the sum of the magnetizing current $i_{lm}$ flowing through $L_m$ plus the current $i_x$ through the primary of the ideal transformer. Due to the nature of the transformer core reset circuit, the magnetizing current $i_{lm}$ has no average value during the time when switch 111 is conducting. An explanation of the shape of $i_x$ follows. During the time when power switch 111 is conducting a voltage is placed across the primary of ideal transformer 210 in such a way as to cause the current through the output filter inductor 133 to flow through the secondary winding of the ideal transformer 210 through the rectifier diode 131. During the conduction interval of power switch 111 the current through the primary of the ideal transformer 210 is equal to the current $i_l$, shown by waveform 301, through the output inductor 133 multiplied by a factor equal to the secondary to primary transformer turns ration $N_s/N_p$.

Waveform 311, designated $i_{ql}$, in FIG. 3 shows the current through the power switch 111, which is at zero when the switch 111 is turned off (i.e. non-conducting), and equal to the transformer primary current $i_p$ when the switch is turned on (i.e. conducting). The shape of waveform 311 in FIG. 2 also represents the shape of the voltage waveform $v_{r1}$ developed across the current sense resistor 107. This voltage is proportional to the current flowing through the power switch 111, with the constant of proportionality being the value of resistor 107. Waveform 317, designated $V_g$ indicates the conduction interval of the main power switch 111, with a positive value of waveform $V_g$ corresponding to the conduction time of the power switch 111.

Figure 4:
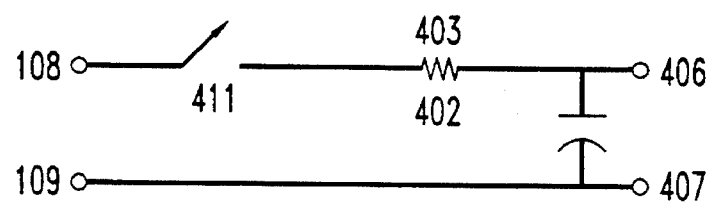
FIG. 4 shows a circuit schematic for describing aspects of the invention.

An ideal average output current sensing circuit, as shown in FIG. 4, consists conceptually of an ideal switch 411, and a low-pass filter two port network 402 consisting of resistor 403 and capacitor 404. An intermittent pulsed voltage waveform such as shown by wavefom $v_{r1}$ in FIG. 3 is applied across the terminals 108 and 109 of the average output current sensing circuit. The pulsed voltage waveform is proportional in magnitude to the current flowing through the switching device of the power supply. The ramp portion 312 of the voltage signal is due to switched currents resulting from the effect of magnetizing components such as inductors and transformers included in the power supply. The pulsed current flows through the power switch 111 only when the switch 111 is on (i.e. conducting). A pulsed voltage as shown by wavefom 317 and designated $V_g$ in FIG. 3 has a finite magnitude at the times when current flows through the power switch 111, and therefore can be used to control the conduction of the switch 411. A voltage at the output terminals 406 and 407 is essentially a DC voltage proportional to the average value of the output current $i_{lf}$ of the circuit in FIG. 1. The constants of proportionality are fixed and known.

Figure 5:
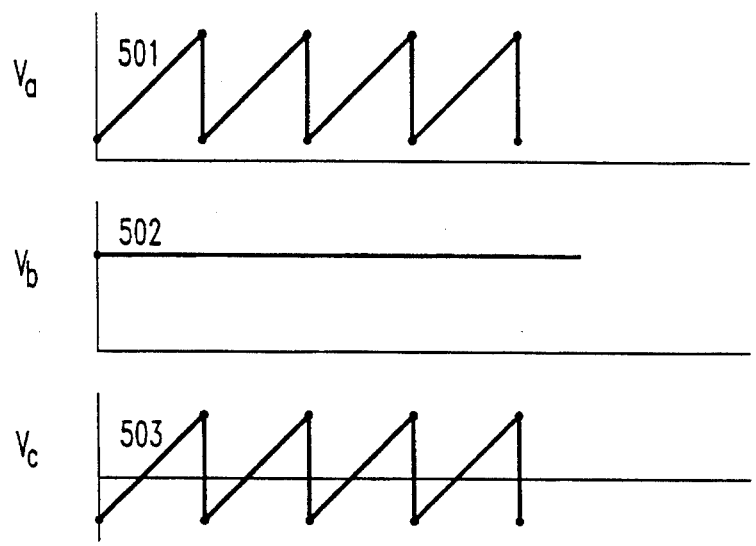
FIG. 5 depict waveforms relevant to the operation of the invention.

For certain types of switch mode power converter topologies the value of the voltage across the output terminals of the average current sensing circuit can be shown to be substantially proportional to the average current through the output filter inductor. When the switch 411 is open, no current can flow into or out of capacitor 404 and the value of voltage at the output of the average current sensing network remains fixed during this interval. The voltage across capacitor 411, the state of the only energy storing component in the average current sensing network, remains unchanged during the interval when switch 411 is open. Therefore, the value of the voltage at the output terminals 406 and 407 of the average current sensing network, for times when the switch 411 is both open and closed, may be found by disregarding the input waveform across terminals 108 and 109 during the interval when the switch 411 is open. Waveform 501 designated $v_a$ in FIG. 5 shows the input signal to the average current sensing network with the portion of the signal present during the time switch 411 is open removed. This signal can be considered as the sum of two waveforms 502, $v_b$, and 503, $v_c$, shown in FIG. 5. Waveform 502, $v_b$, is a DC signal whose value is proportional to the average output current of the power supply, with the constant of proportionality being the known value of the transformer secondary to primary turns ratio $N_s/N_p$, times the value of the sense resistor 107 in FIG. 1. Waveform 503, $v_c$, is the sum of the power transformer AC magnetizing current and the output filter inductor AC ripple current, and has no DC component for the switch mode power supply illustrated in FIG. 1.

Since the low-pass network of filter 402 is linear, the time response of the voltage across the capacitor 404, which is the output of the average current sensing network, can be found by considering the superposition of the response of the filter network to the waveforms $v_b$ and $v_c$. The low-pass network passes the DC value of waveform $v_b$, which is the voltage proportional to the output current of the power supply. Note that average current sensing network of FIG. 4 has a DC impedance equal to that of capacitor 404, and therefore does not introduce any loading errors into the average current estimate. If the filter components resistor 403 and capacitor 404 are chosen so that the filter roll-off frequency is sufficiently below the fundamental frequency of the AC waveform $v_c$, the magnitude contribution of this waveform to the voltage at the output of the average current sensing network can be made arbitrarily small. Therefore the voltage at the output of the average current sensing network is substantially equal to the value of waveform $v_b$, which itself is proportional to the average output current of the power supply.

Figure 6:
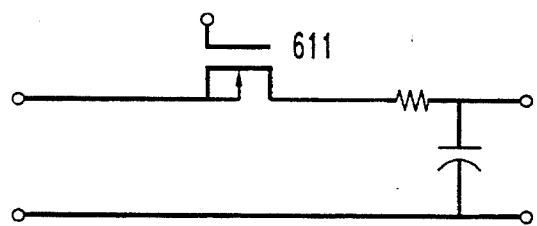
FIG. 6 is a circuit schematic which represents an embodiment of a current sensing circuit of the present invention.
Figure 7:
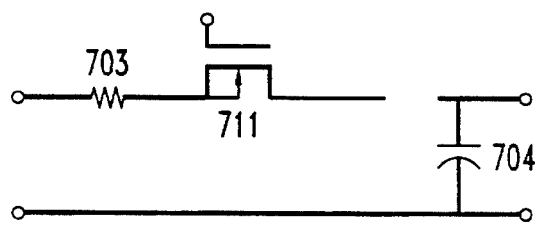
FIG. 7 is a circuit schematic which represents an embodiment of a current sensing circuit of the present invention.
Figure 8:
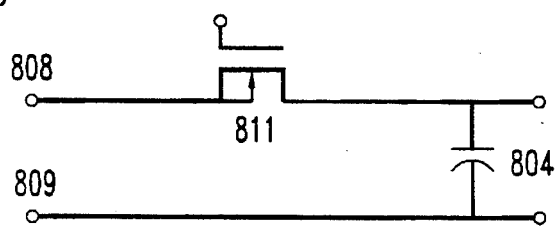
FIG. 8 is a circuit schematic which represents an embodiment of a current sensing circuit of the present invention.

FIG. 6. shows a practical implementation of the average current sensing circuit using an FET switch 611. Implementing the switch 411 of FIG. 4 with an FET device 611 yields a switching element that introduces substantially no error voltage to the output voltage of the average switch current sensing circuit due to semiconductor voltage drops. This contrasts to the potential drop incurred across the diode of a peak detector circuit, which is often large compared to the voltage signal representing the switch current. FIG. 7 shows another practical implementation of the average current sensing circuit consisting of resistor 703, switch 711 and capacitor 704 with switch 711 connecting resistor 703 to capacitor 704. Arranging the average current sensing circuit in this way suppresses the appearance of a voltage spike across the impedance of the current sensing means, connected between terminals 108 and 109, due to the pulse of current flowing through the gate to source capacitance during turn-on of the FET switch. FIG. 8 shows yet another practical implementation of an average current sensing circuit in which switch 811 connects the input terminals 808 and 809 to capacitor 804. In this implementation the on-state resistance of the FET switch 811 is used to form a low-pass filter network in conjunction with the capacitance of capacitor 804.

Figure 9:
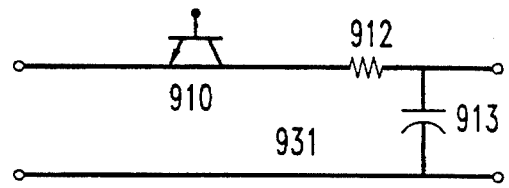
FIG. 9 is a circuit schematic which represents an embodiment of a current sensing circuit of the present invention.

The schematic of FIG. 9 shows yet another implementation of an average current sensing network consisting of NPN transistor 910 and low-pass filter 931, including the resistor 912 and a capacitor 913. This implementation has an error term due to the saturation voltage drop across the NPN transistor collector-emitter terminals.

Figure 10:
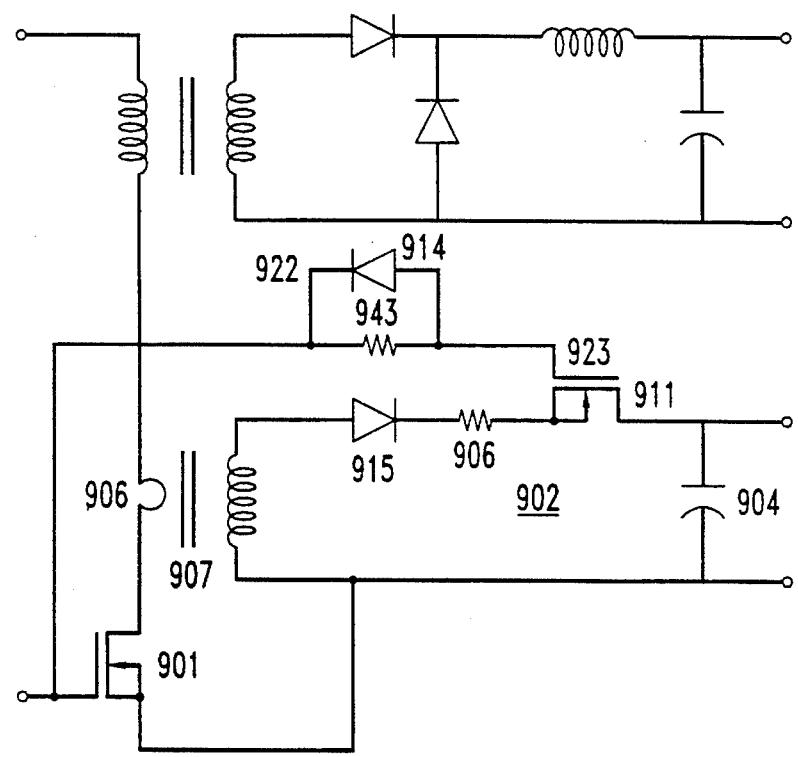
FIG. 10 is a circuit schematic of a switch mode power supply incorporating an average current sensing circuit.

FIG. 10 shows a power supply circuit consisting of an isolated buck type converter including an average current detector. The current flowing through the FET power switch is sensed by a circuit consisting of current sensing transformer 907, diode 915, and resistor 906 (the current sense reset network is not shown). The voltage across resistor 906 is proportional to the current flowing through the power switch 901. The gating voltage of the power FET switch 901, placed across terminals 916 and 917 is connected to the input terminal 923 of the FET switch 911 through network 922, which consists of resistor 943 in shunt with diode 914. This network adjusts the gating of FET switch 911 to accurately coincide with the presence of switch current through power FET switch 901. The gating voltage of the power FET switch 911 does not correspond exactly to the flow of current through the device.

For isolated switch mode power converter topologies where the average of the power transformer magnetizing current ($I_{lm}$ in FIG. 3) or its equivalent is either substantially zero, or substantially proportional to the average output current, the output of the average current sensing circuit can be used to accurately infer the average output current of the switch mode power supply. For non-isolated buck, boost, and buck-boost derived topologies operating in the continuous conduction mode, the output of the average current sensing circuit can be used to accurately infer the average output current of the switch mode power supply. For other isolated switch mode power converters, the combination of the averaging effect of the switch current signal, plus the lack of semiconductor offset voltages, enables the average current sensing circuit to produce an output more closely related to the average output current of a switch mode power converter than could be obtained using methods of the prior art.

Figure 11:
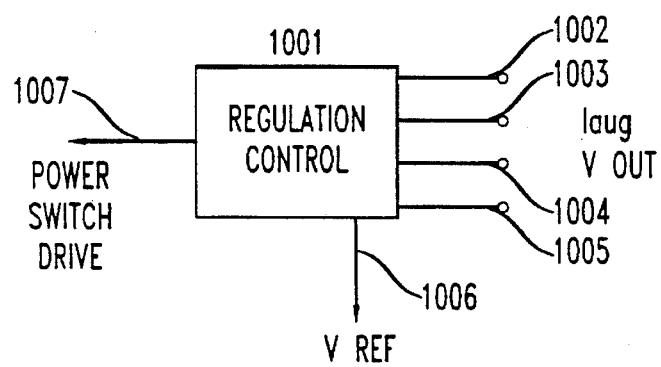
FIG. 11 is an illustrative feedback arrangement for the circuits herein.

Regulation control may be achieved by an integrated regulation control circuit as shown in the FIG. 11. The regulation control circuit 1001 is connected to receive the inputs representative of the average current determined by the circuitry disclosed above which is applied to the inputs 1002 and 1003, and inputs responsive to the output voltage at inputs 1004 and 1005. A reference voltage is suplied at input lead 1006. A power switch bias or drive signal is supplied at the lead 1007 and is applied to a gate or control input of the power switch.

Figure 12:
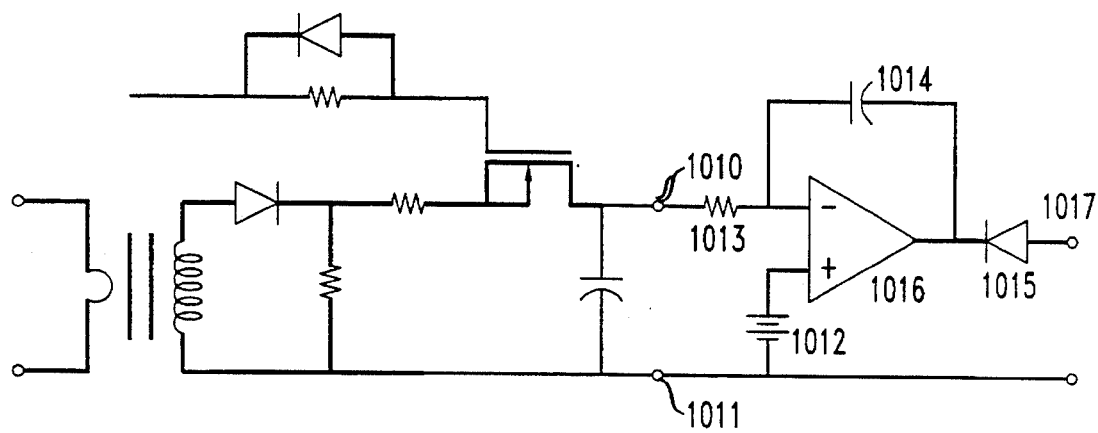
FIG. 12 is a circuit schematic of another illustrative feedback circuit suitable for application to the power circuits herein.

Regulation control may also be achieved by a circuit such as shown in FIG. 12. The voltage at the output of the average current sensing circuit circuit, terminals 1010 and 1011, is fed into the inverting input of amplifier 1016 through resistor 1013. A reference voltage 1012 is placed into the non-inverting input of amplifier 1016. Capacitor 1014 placed from the output to the inverting input of amplifier 1016 creates an inverting integrator function such that the voltage at the output of amplifier 1016 will fall, causing the voltage between terminals 1017 and 1011 to fall, whenever the voltage at the inverting input of amplifier 1016 exceeds the value of the reference voltage 1012. The output of this circuit, the voltage between terminal 1017 and 1011, can be used to control the duty cycle of the switch mode converter, thus enabling limiting control over the amount of the converter's average output current. Diode 1015 is used to disconnect the output of the amplifier 1016 from terminal 1017 when the unit is operating at a current level of a certain range.

Figure 13:
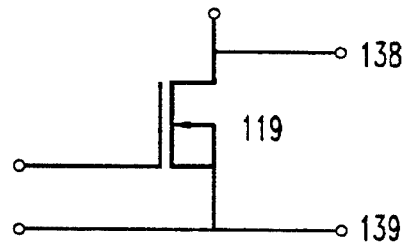
FIGS. 13 and 14 show additional arrangements to sense current in a power switch.

FIG. 13 shows an alternate means of sensing the current flow through the power switch 119. Terminals 138 and 139 are connected to the terminals 108 and 109 of the average current sensing circuit of FIG. 4. The connection places these terminals directly across the main current flow path of the power switch 119. this power switch may be connected as is the switch 111 in the power supply as shown in the FIG. 1. In this configuration, the on state resistance of the FET switch 119 is used to translate the current through the FET switch to a voltage signal.

Figure 14:
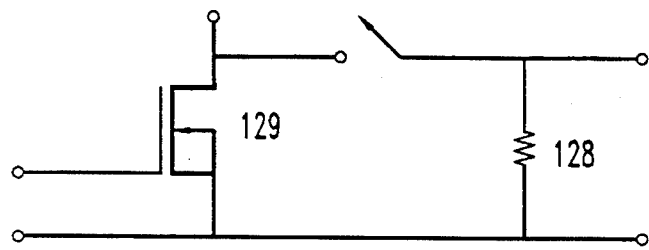

The arrangement of FIG. 14 senses the current of the power switch 129 by using the known on state resistance of the FET The conduction terminals of the FET switch 129 are connected to the resistor 128 through the switch 121. The drive biasing the second switch 121 is in phase and time coincidence with the bias drive for switch 129. The voltage across resistor 128 is used as the current sense signal.

I claim:

1. A switch mode power supply comprising:

an input and an output;

a power switch enabling coupling of energy from the input to the output;

a current sensing means connected to sense a current in the power switch;

means for estimating a current at the output including an input port connected to the current sensing means and an output port;

a low pass filter in which the state of the filter can be held for a time interval without change and including a resistive impedance and a charge storage capacitor;

a second switch connecting the low pass filter to the current sensing means and the resistive impedance being connected in series with the second switch and the charge storage capacitor connected in shunt with an output of the low pass filter and in shunt with the output port;

a means for intermittently biasing the second switch conducting in phase with conductively of the power switch; and means for supplying a signal respective of the average output current from the output of the low pass filter through the output port.

2. A switch mode power supply as claimed in claim 1 wherein:

the current sensing means comprises a resistor connected in series with the power switch.

3. A switch mode power supply as claimed in claim 1 wherein:
   the resistive impedance is connected between the current sensing means and the second switch.

4. A switch mode power supply as claimed in claim 1 wherein:
   the resistive impedance is connected between the second switch and the charge storage capacitor.

5. A switch mode power supply as claimed in claim 1 wherein:
   the second switch is a FET device.

6. A switch mode power supply as claimed in claim 1 wherein:
   the FET device supplies the resistive impedance for the low pass filter.

7. A switch mode power supply as claimed in claim 1 wherein:
   the means for intermittently biasing includes a parallel connected resistor and diode coupling a control electrode of the power switch to a control electrode of the second switch.

8. A switch mode power supply as claimed in claim 1 wherein:
   the power switch is a FET device.

9. A switch mode power supply as claimed in claim 1 wherein:
   the switch mode power supply includes a power transformer between the input and output and the power switch biased to periodically couple the input to the power transformer.

10. A switch mode power supply as claimed in claim 1, wherein
    the current sensing means comprises a current sensing transformer.

11. A switch mode power supply as claimed in claim 1, wherein;
    the current sensing means includes means for sensing a voltage across the power switch; whereby a on-state resistance of the power switch is utilized for generating a current responsive voltage.

12. A switch mode power supply as claimed in claim 1, wherein;
    the current sensing means includes a third switch connecting the conducting terminals of the power switch to a resistor; and
    a means of intermittently biasing the third switch conducting in-phase with the conductivity of the power switch.

13. A switch mode power supply comprising:
    an input and an output coupled by a periodically enabled power switch;
    means for estimating a current at the output including:
    means for sensing a current through the power switch;
    a low pass filter having a resistive impedance and a charge storage capacitor;
    a second switch for coupling the low pass filter to the means for sensing; the second switch being connected in series with the resistive impedance and the charge storage capacitor shunting an output of the low pass filter with the voltage across the charge storage capacitor representing an averaged current at the output;
    means for biasing the second switch conducting in phase and having a substantially equal interval with the power switch.

14. A switch mode power supply as claimed in claim 13 and further comprising:
    means for responding to the low pass filter for generating an error signal representative of the estimated current.

15. A switch mode power supply as claimed in claim 13 wherein:
    the second switch is a FET device.

16. A switch mode power supply as claimed in claim 13 wherein:
    the second switch is a bipolar transistor.

17. A switch mode power supply as claimed in claim 13 wherein:
    the resistive impedance is provided by utilizing a resistance of the FET device.

18. A switch mode power supply as claimed in claim 15 and further comprising:
    means for driving the FET device to coincide with presence of current through the power switch by coupling the drive for the power switch to a drive electrode of the FET device through a network including a paralleled diode and resistor.

19. Circuitry for sensing an average current flow through a periodically enabled current flow control switch; comprising:
    means for generating a voltage in response to current flow through the current flow control switch;
    a low pass filter having a resistive impedance and a charge storage capacitor;
    a second switch for coupling the low pass filter to the means for generating a voltage the second switch being connected in series with the resistive impedance and the charge storage capacitor shunting an output of the low pass filter with the voltage across the charge storage capacitor representing an averaged current at the output;
    means for biasing the second switch conducting in phase and having substantially equal interval with the current flow control switch.

\* \* \* \* \*